(12) United States Patent
Yoshida

(10) Patent No.: US 8,531,817 B2
(45) Date of Patent: Sep. 10, 2013

(54) CERAMIC ELECTRONIC COMPONENT

(75) Inventor: Akihiro Yoshida, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 13 days.

(21) Appl. No.: 13/187,607

(22) Filed: Jul. 21, 2011

(65) Prior Publication Data

US 2012/0019981 A1     Jan. 26, 2012

(30) Foreign Application Priority Data

Jul. 21, 2010 (JP) .................................. 2010-164110
Jun. 10, 2011 (JP) .................................. 2011-130034

(51) Int. Cl.
*H01G 4/005* (2006.01)
*H01G 4/06* (2006.01)

(52) U.S. Cl.
USPC ................ 361/321.2; 361/321.1; 361/303

(58) Field of Classification Search
USPC ..................... 361/303, 321.1, 321.2
See application file for complete search history.

(56) References Cited

U.S. PATENT DOCUMENTS

| | | |
|---|---|---|
| 2005/0264975 A1 | 12/2005 | Yamazaki |
| 2010/0067170 A1* | 3/2010 | Koga .................... 361/306.3 |

FOREIGN PATENT DOCUMENTS

| | | |
|---|---|---|
| EP | 1 783 790 A1 | 5/2007 |
| EP | 1 848 010 A1 | 10/2007 |
| GB | 2 344 222 A | 5/2000 |
| JP | 09-153429 A | 6/1997 |
| JP | 11-026295 A | 1/1999 |
| JP | 2002-015940 A | 1/2002 |
| JP | 2002015940 A * | 1/2002 |
| WO | 2009/139112 A1 | 11/2009 |

OTHER PUBLICATIONS

Official Communication issued in corresponding European Patent Application No. 11173108.9, mailed on Oct. 31, 2011.
Yoshida, "Ceramic Electronic Component", U.S. Appl. No. 13/187,612, filed Jul. 21, 2011.
Sato et al., "Ceramic Electronic Component", U.S. Appl. No. 13/187,617, filed Jul. 21, 2011.

* cited by examiner

*Primary Examiner* — Eric Thomas
*Assistant Examiner* — Arun Ramaswamy
(74) *Attorney, Agent, or Firm* — Keating & Bennett, LLP

(57) ABSTRACT

A ceramic electronic component includes a first reinforcement layer. The first reinforcement layer is arranged in a first outer layer portion so as to extend in the length direction and in the width direction. Portions of the first reinforcement layer face a first portion of a first external electrode and a first portion of a second external electrode in the thickness direction. The first reinforcement layer is not exposed at a first end surface or a second end surface of the ceramic electronic component. In a portion of a first main surface of the ceramic electronic component in which the first portion of the first or second external electrode is provided, a portion that does not face the first reinforcement layer is closer to the center in the thickness direction than a portion that faces the first reinforcement layer.

5 Claims, 16 Drawing Sheets

CERAMIC ELECTRONIC COMPONENT

BACKGROUND OF THE INVENTION

1. Field of the Invention

The present invention relates to a ceramic electronic component.

2. Description of the Related Art

With the recent reduction in size and thickness of electronic devices, such as mobile phones and portable music players, wiring boards mounted in the electronic devices have become increasingly compact. Accordingly, ceramic electronic components mounted on the wiring boards have also become smaller and thinner.

In the related art, ceramic electronic components including rectangular-parallelepiped ceramic bodies have a relatively high mechanical strength, whereas ceramic electronic components including thin flat ceramic bodies have a low mechanical strength. Furthermore, the mechanical strength of the ceramic electronic components tends to decrease as the thickness of the ceramic bodies decreases. Therefore, it is difficult to increase the mechanical strength of a ceramic electronic component having a flat ceramic body.

Examples of a method for increasing the mechanical strength of a ceramic electronic component include a method for forming reinforcement conductor layers (buffer layers) in a ceramic body, as described in Japanese Unexamined Patent Application Publication No. 11-26295.

However, even reinforcement conductor layers provided in a ceramic body may not sufficiently prevent occurrences of cracks in a ceramic electronic component. Therefore, it may still be difficult to sufficiently improve the mechanical durability of the ceramic electronic component.

SUMMARY OF THE INVENTION

To overcome the problems described above, preferred embodiments of the present invention provide a ceramic electronic component with high mechanical durability.

According to a preferred embodiment of the present invention, a ceramic electronic component preferably includes a ceramic body having a substantially rectangular parallelepiped shape, a first internal electrode, a second internal electrode, a first external electrode, and a second external electrode. The ceramic body includes a first main surface, a second main surface, a first side surface, a second side surface, a first end surface, and a second end surface. The first main surface and the second main surface extend in a length direction of the ceramic body and in a width direction of the ceramic body. The first side surface and the second side surface extend in the length direction and in a thickness direction of the ceramic body. The first end surface and the second end surface extend in the width direction and in the thickness direction. The first internal electrode and the second internal electrode are disposed inside the ceramic body. The first internal electrode and the second internal electrode extend in the length direction and in the width direction. The first internal electrode and the second internal electrode face each other in the thickness direction. The first external electrode is provided on the ceramic body. The first external electrode is electrically connected to the first internal electrode. The second external electrode is provided on the ceramic body. The second external electrode is electrically connected to the second internal electrode. Each of the first external electrode and the second external electrode preferably includes a first portion located on an end portion of the first main surface in the length direction, and a second portion located on the first end surface or the second end surface. The ceramic body includes an effective portion in which the first internal electrode and the second internal electrode face each other in the thickness direction, a first outer layer portion that is located closer to the first main surface than the effective portion, and a second outer layer portion that is located closer to the second main surface than the effective portion. The ceramic electronic component preferably further includes a first reinforcement layer. The first reinforcement layer is provided in the first outer layer portion so as to extend in the length direction and in the width direction. The first reinforcement layer includes a portion facing the first portion of the first external electrode in the thickness direction and a portion facing the first portion of the second external electrode in the thickness direction. The first reinforcement layer is not exposed from the first end surface or from the second end surface. In a portion of the first main surface in which the first portion of the first external electrode or the second external electrode is provided, a portion that does not face the first reinforcement layer is preferably closer to a center of the ceramic body in the thickness direction than a portion that faces the first reinforcement layer.

In the ceramic electronic component, in the first portion of each of the first external electrode and the second external electrode, a portion that does not face the first reinforcement layer may preferably be thicker than a portion that faces the first reinforcement layer.

In the ceramic electronic component, each of the first external electrode and the second external electrode may preferably include a first conductor layer provided on the first end surface or the second end surface and on an end portion of the first main surface in the length direction, and a second conductor layer arranged so as to cover the first conductor layer. In a portion of the first conductor layer of each of the first external electrode and the second external electrode that defines the first portion, a portion that does not face the first reinforcement layer may preferably be thicker than a portion that faces the first reinforcement layer.

In the ceramic electronic component, the first reinforcement layer may preferably be made of a metal or an alloy, for example. That is, in a preferred embodiment of the present invention, the reinforcement layer may preferably be made of a conductor layer.

In the ceramic electronic component, each of the first external electrode and the second external electrode may preferably further include a third portion located on an end portion of the second main surface in the length direction. The ceramic electronic component may preferably further include a second reinforcement layer provided in the second outer layer portion so as to extend in the length direction and in the width direction. The second reinforcement layer may include a portion facing the third portion of the first external electrode in the thickness direction and a portion facing the third portion of the second external electrode in the thickness direction. The second reinforcement layer may not be exposed from the first end surface or the second end surface. In a portion of the second main surface in which the third portion of the first external electrode or the second external electrode is provided, a portion that does not face the second reinforcement layer may preferably be closer to the center of the ceramic body in the thickness direction than a portion that faces the second reinforcement layer is.

According to various preferred embodiments of the present invention, the mechanical durability of a ceramic electronic component is significantly improved.

The above and other elements, features, steps, characteristics, and advantages of the present invention will become

DETAILED DESCRIPTION OF THE PREFERRED EMBODIMENTS

First Preferred Embodiment

A first preferred embodiment of the present invention will be described hereinafter in the context of a ceramic electronic component 1 illustrated in FIG. 1, by way of example. However, the ceramic electronic component 1 is merely illustrative. Preferred embodiments of the present invention are not limited to the ceramic electronic component 1 described below and a method for manufacturing the ceramic electronic component 1.

Figure 1:
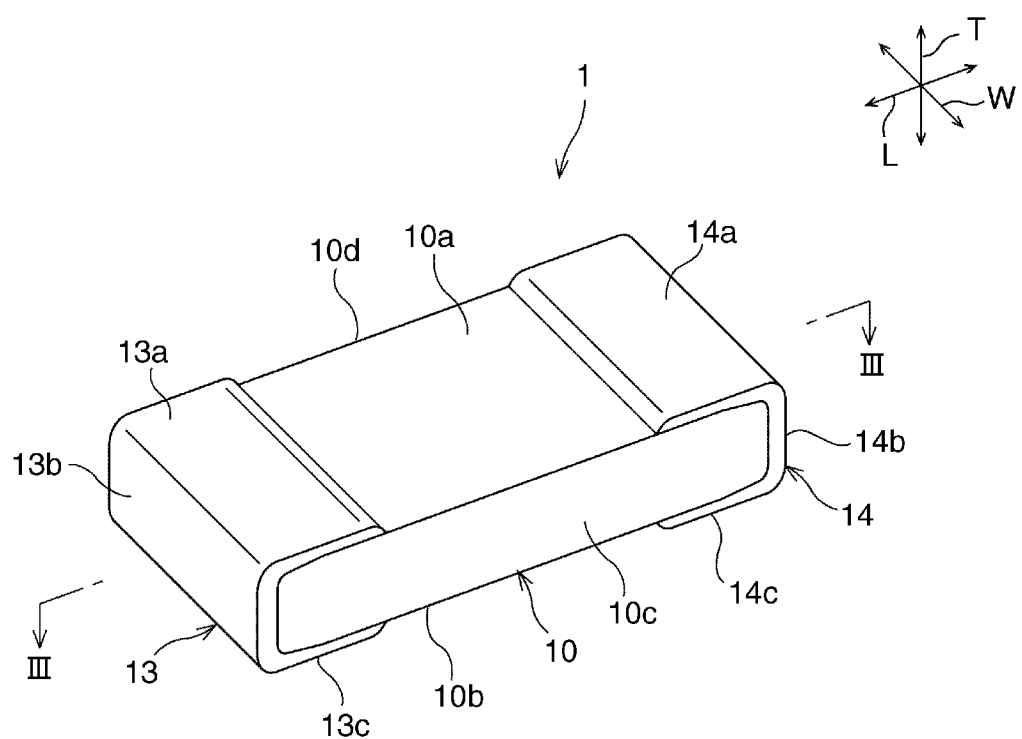
FIG. 1 is schematic perspective view of a ceramic electronic component according to a first preferred embodiment of the present invention.
Figure 2:
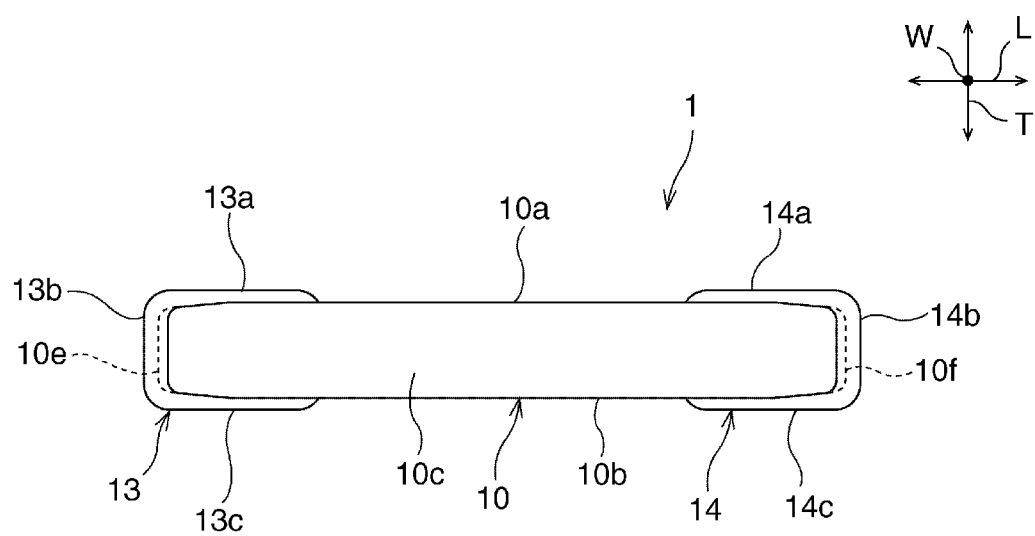
FIG. 2 is a schematic side view of the ceramic electronic component according to the first preferred embodiment of the present invention.
Figure 3:
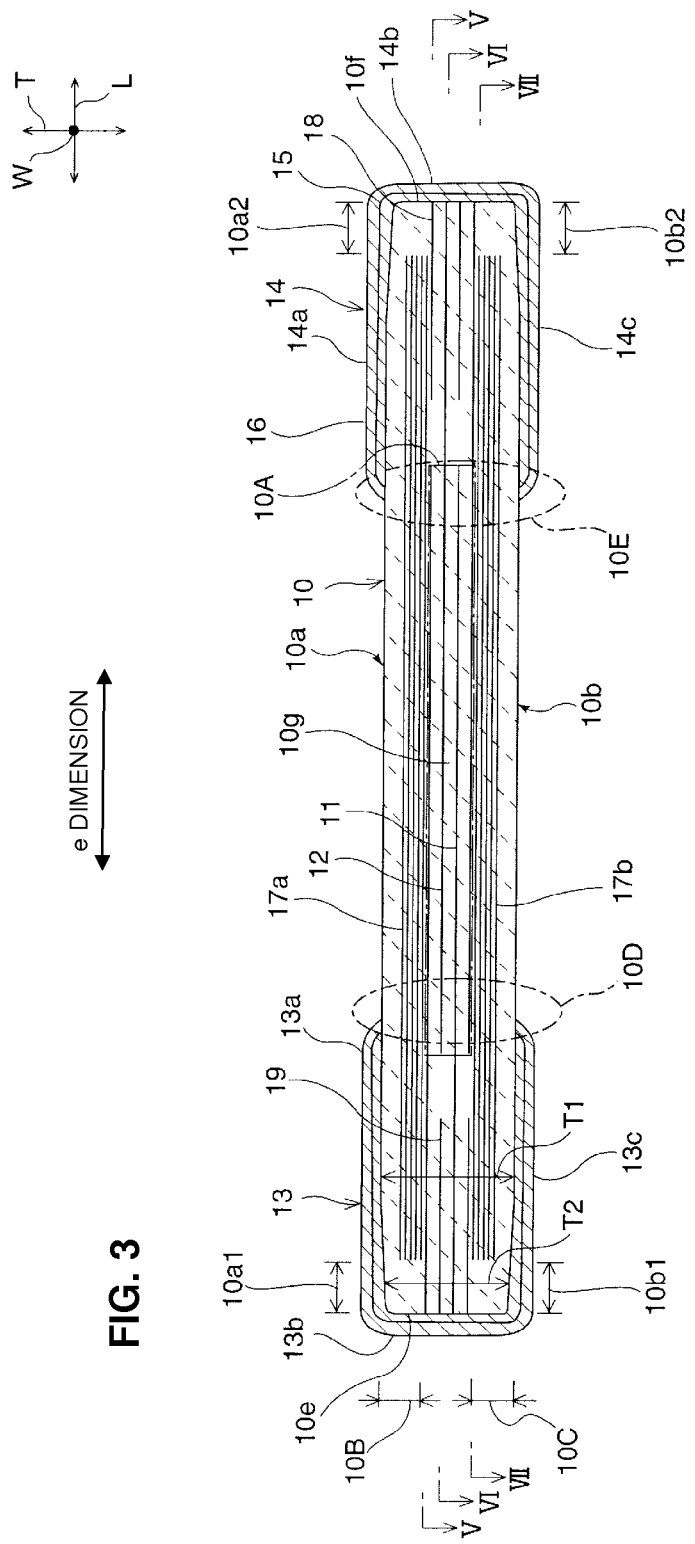
FIG. 3 is a schematic cross-sectional view taken along line III-III in FIG. 1.
Figure 4:
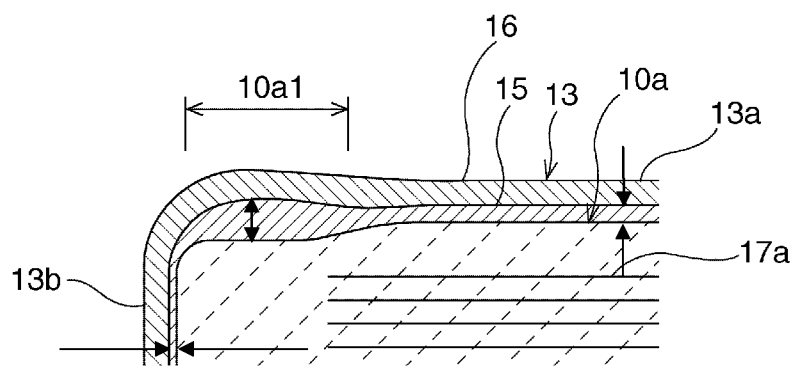
FIG. 4 is a schematic cross-sectional view of an enlarged portion of the ceramic electronic component according to the first preferred embodiment of the present invention.
Figure 5:
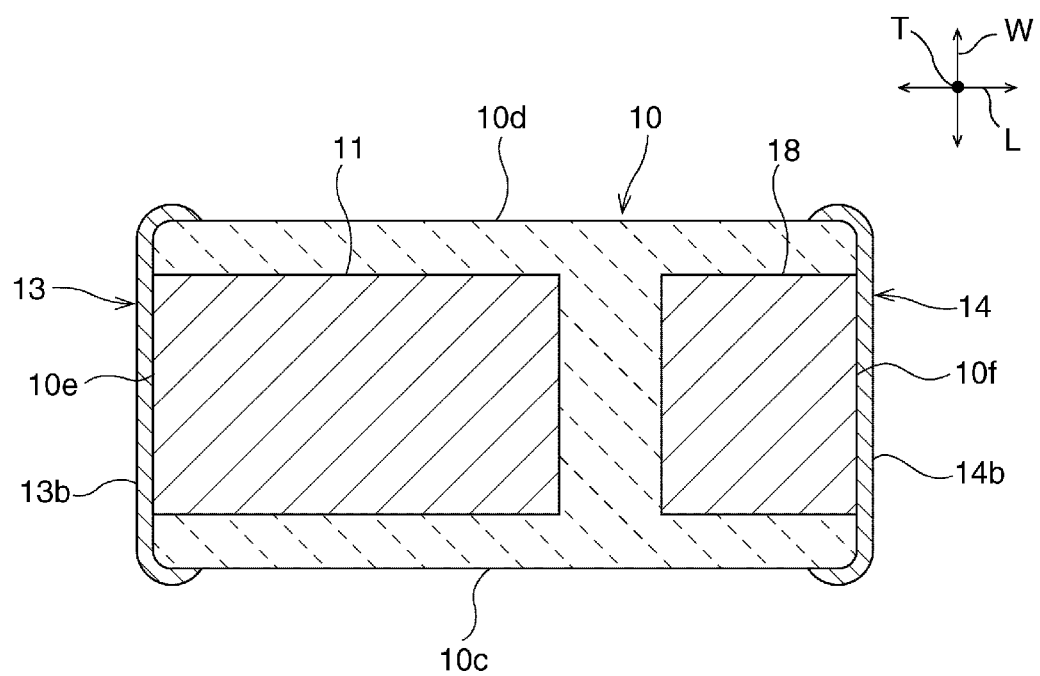
FIG. 5 is a schematic cross-sectional view taken along line V-V in FIG. 3.

FIG. 1 is a schematic perspective view of a ceramic electronic component according to the first preferred embodiment of the present invention. FIG. 2 is a schematic side view of the ceramic electronic component according to the first preferred embodiment. FIG. 3 is a schematic cross-sectional view taken along line III-III in FIG. 1. FIG. 4 is a schematic cross-sectional view of an enlarged portion of the ceramic electronic component according to this preferred embodiment. FIG. 5 is a schematic cross-sectional view taken along line V-V in FIG. 3.

Figure 6:
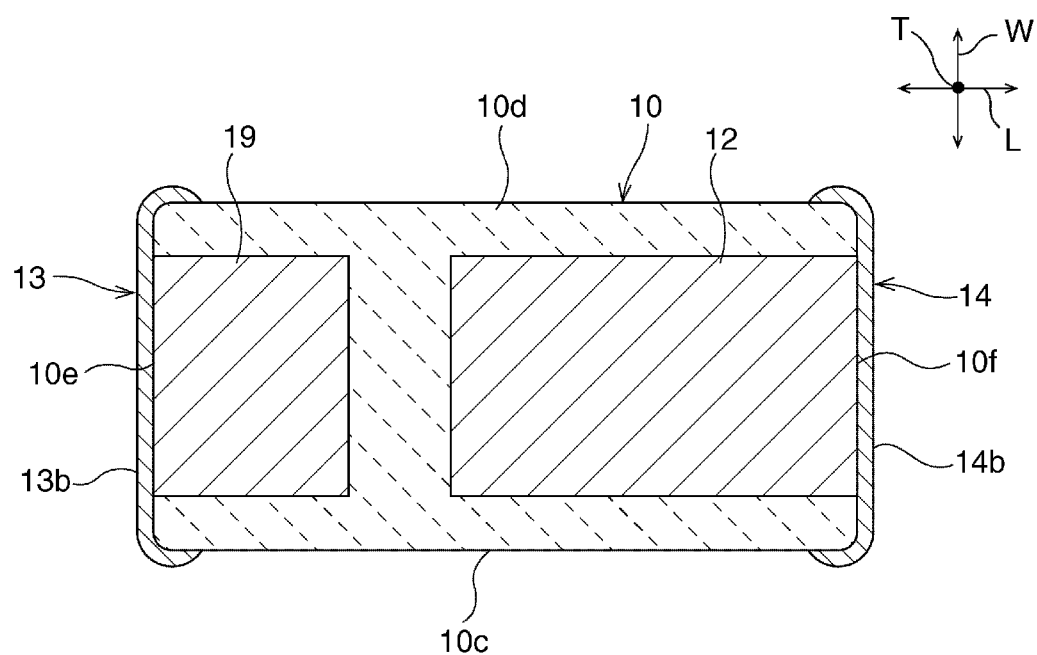
FIG. 6 is a schematic cross-sectional view taken along line VI-VI in FIG. 3.
Figure 7:
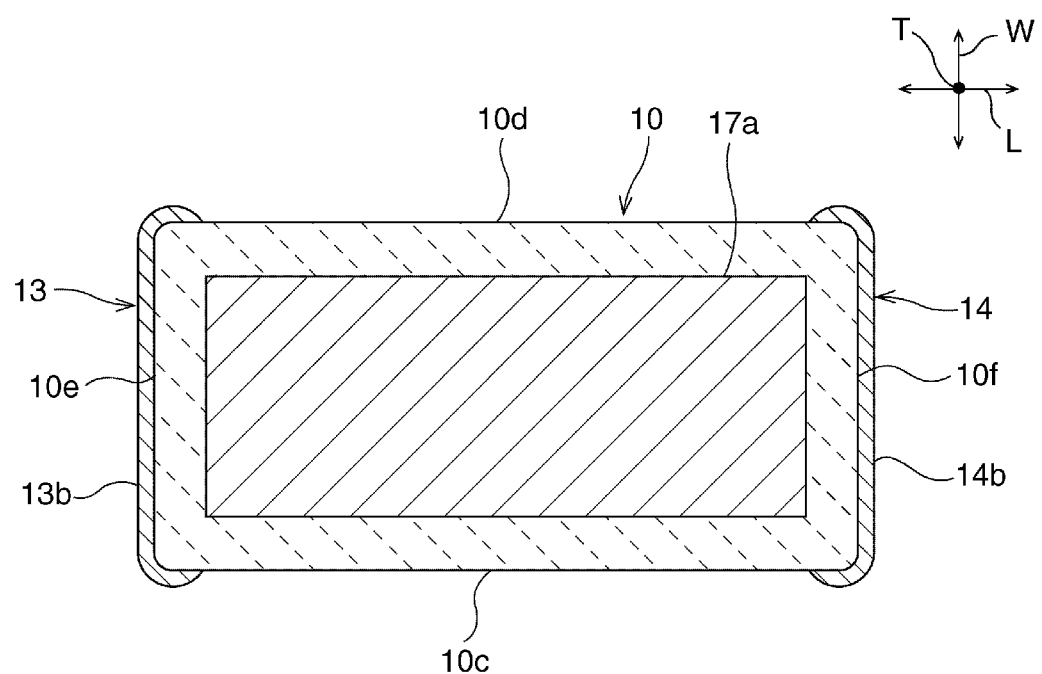
FIG. 7 is a schematic cross-sectional view taken along line VII-VII in FIG. 3.

FIG. 6 is a schematic cross-sectional view taken along line VI-VI in FIG. 3. FIG. 7 is a schematic cross-sectional view taken along line VII-VII in FIG. 3.

First, the configuration of the ceramic electronic component 1 will be described with reference to FIGS. 1 to 7.

As illustrated in FIGS. 1 to 7, the ceramic electronic component 1 includes a ceramic body 10. The ceramic body 10 is made of an appropriate ceramic material in accordance with the functionality of the ceramic electronic component 1. Specifically, when the ceramic electronic component 1 is a capacitor, the ceramic body 10 may preferably be made of a dielectric ceramic material. Specific examples of the dielectric ceramic material include $BaTiO_3$, $CaTiO_3$, $SrTiO_3$, and $CaZrO_3$. The ceramic body 10 may preferably include any of the ceramic materials described above as a main component, and, as sub-components, for example, a Mn compound, a Mg compound, a Si compound, a Fe compound, a Cr compound, a Co compound, a Ni compound, a rare-earth compound, and the like may be optionally added in accordance with the desired characteristics of the ceramic electronic component 1.

When the ceramic electronic component 1 is a ceramic piezoelectric element, the ceramic body 10 may preferably be made of a piezoelectric ceramic material. Specific examples of the piezoelectric ceramic material include lead zirconate titanate (PZT) ceramic materials.

When the ceramic electronic component 1 is a thermistor element, the ceramic body 10 may preferably be made of a semiconductor ceramic material. Specific examples of the semiconductor ceramic material include spinel ceramic materials.

When the ceramic electronic component 1 is an inductor element, the ceramic body 10 may preferably be made of a magnetic ceramic material. Specific examples of the magnetic ceramic material may include ferrite ceramic materials.

In the following description of this preferred embodiment, the ceramic electronic component 1 is a ceramic capacitor, by way of example. More specifically, in this preferred embodiment, by way of example, the ceramic electronic component 1 is a ceramic capacitor preferably having a capacitance of about 0.1 nF to about 100 nF.

The ceramic body 10 preferably has a substantially rectangular parallelepiped shape. As illustrated in FIGS. 1 to 7, the ceramic body 10 includes a first main surface 10a, a second main surface 10b, a first side surface 10c, a second side surface 10d, a first end surface 10e, and a second end surface 10f. As illustrated in FIGS. 1 to 3, the first and second main surfaces 10a and 10b extend in the length direction L and in the width direction W. As illustrated in FIGS. 1 and 5 to 7, the first and second side surfaces 10c and 10d extend in the thickness direction T and in the length direction L. As illustrated in FIGS. 2 to 7, the first and second end surfaces 10e and 10f extend in the thickness direction T and in the width direction W.

The term "rectangular parallelepiped" or "substantially rectangular parallelepiped", as used herein, includes a rectangular parallelepiped shape with chamfered or R-chamfered corners or edges. That is, the term "rectangular parallelepiped member" or "substantially rectangular parallelepiped member" means a member including first and second main surfaces, first and second side surfaces, and first and second end surfaces. Further, a portion or the entirety of the main surfaces, the side surfaces, and the end surfaces may include some irregularities. That is, the main surfaces, the side surfaces, and the end surfaces may not necessarily be flat.

The dimensions of the ceramic body 10 are not particularly limited. However, the ceramic body 10 is preferably thin, satisfying T≦W<L, about 1/5W≦T≦about 1/2W, and T≦about 0.3 mm, where T, L, and W denote the thickness, length, and width of the ceramic body 10, respectively. Specifically, the ceramic body 10 is preferably, about 0.1 mm≦T≦about 0.3 mm, about 0.4 mm≦L≦about 1 mm, and about 0.2 mm≦W≦about 0.5 mm, for example.

The thickness of a ceramic layer 10g is not particularly limited. The thickness of the ceramic layer 10g may preferably be in the range of, for example, about 0.5 μm to about 10 μm.

As illustrated in FIG. 3, in the ceramic body 10, a plurality of first substantially rectangular internal electrodes 11 and a plurality of second substantially rectangular internal electrodes 12 are alternately arranged at equal or substantially equal intervals in the thickness direction T. Each of the first internal electrodes 11 and the second internal electrodes 12 is substantially parallel to the first main surface 10a and the second main surface 10b.

As illustrated in FIGS. 3 and 5, the first internal electrodes 11 are arranged so as to extend in the length direction L and in the width direction W. The first internal electrodes 11 are exposed from the first end surface 10e of the ceramic body 10, and extend from the first end surface 10e toward the second end surface 10f. The first internal electrodes 11 do not reach the second end surface 10f, the first side surface 10c, or the second side surface 10d. The second internal electrodes 12 are also arranged so as to extend in the length direction L and in the width direction W. As illustrated in FIGS. 3 and 6, the second internal electrodes 12 are exposed from the second end surface 10f of the ceramic body 10, and extend from the second end surface 10f toward the first end surface 10e. The second internal electrodes 12 do not reach the first end surface 10e, the first side surface 10c, or the second side surface 10d. The first and second internal electrodes 11 and 12 are preferably arranged at the same position in the width direction W. Thus, the first internal electrodes 11 and the second internal electrodes 12 face each other with the ceramic layer 10g disposed therebetween in a central portion of the ceramic body 10 in the length direction L. In both end portions of the ceramic body 10 in the length direction L, the first internal electrodes 11 and the second internal electrodes 12 do not face each other in the thickness direction T.

A portion of the ceramic body 10 at which the first internal electrodes 11 and the second internal electrodes 12 face each other defines an effective portion 10A that functions as a capacitor. A portion of the ceramic body 10 that is located closer to the first main surface 10a than the effective portion 10A defines a first outer layer portion 10B, and a portion of the ceramic body 10 that is located closer to the second main surface 10b than the effective portion 10A defines a second outer layer portion 10C.

As described above, since the ceramic electronic component 1 is a ceramic capacitor having a relatively low capacitance, the proportion of the effective portion 10A in the ceramic body 10 is relatively small. The length of the effective portion 10A in the thickness direction T is preferably about 0.1 times to about 0.5 times the maximum length of the ceramic body 10 in the thickness direction T, for example. The length of the effective portion 10A in the length direction L is preferably about 0.2 times to about 0.7 times the maximum length of the ceramic body 10 in the length direction L, for example.

Further, preferably, for example, one to ten pairs of first and second internal electrodes 11 and 12 (one first internal electrode 11 and one second internal electrode 12, i.e., two internal electrodes in total, to ten first internal electrodes 11 and ten second internal electrodes 12, i.e., twenty internal electrodes in total) are provided.

Furthermore, as in this preferred embodiment, in a ceramic capacitor having a relatively low capacitance, the distance between first and second internal electrodes may preferably be equal to about two to about eight ceramic layers 10g, for example.

The ceramic body 10 also preferably includes first and second dummy electrodes 18 and 19. The first dummy electrodes 18 are preferably provided at the same position as the first internal electrodes 11 in the thickness direction T so as to face the first internal electrodes 11 at intervals in the length direction L. Thus, the same number of first dummy electrodes 18 as the number of first internal electrodes 11 is preferably provided. The second dummy electrodes 19 are provided at the same position as the second internal electrodes 12 in the thickness direction T so as to face the second internal electrodes 12 at intervals in the length direction L. Thus, the same number of second dummy electrodes 19 as the number of second internal electrodes 12 is preferably provided. The first and second dummy electrodes 18 and 19 do not substantially contribute to the production of electrical characteristics of the ceramic electronic component 1.

The material of the first and second internal electrodes 11 and 12 and the material of the first and second dummy electrodes 18 and 19 are not particularly limited. Each of the first and second internal electrodes 11 and 12 and the first and second dummy electrodes 18 and 19 may preferably be made of, for example, a metal such as Ni, Cu, Ag, Pd, or Au or an alloy containing at least one of the above metals, such as an Ag—Pd alloy. The first and second internal electrodes 11 and 12 may be made of the same material as or a different material from the first and second dummy electrodes 18 and 19.

Further, the thickness of the first and second internal electrodes 11 and 12 and the thickness of the first and second dummy electrodes 18 and 19 are not particularly limited. The thickness of each of the first and second internal electrodes 11 and 12 and the first and second dummy electrodes 18 and 19 may preferably be, for example, about 0.3 μm to about 2 μm. The thickness of the first and second internal electrodes 11 and 12 is preferably the same as the thickness of the first and second dummy electrodes 18 and 19.

As illustrated in FIGS. 1 to 3, a first external electrode 13 and a second external electrode 14 are provided on surfaces of the ceramic body 10. The first external electrode 13 is electrically connected to the first internal electrodes 11. The first external electrode 13 preferably includes a first portion 13a provided on the first main surface 10a, a third portion 13c provided on the second main surface 10b, and a second portion 13b provided on the first end surface 10e. In this preferred embodiment, the first external electrode 13 is preferably arranged so as to be shallowly wrapped around end portions of the first and second side surfaces 10c and 10d in the length direction L. Specifically, the length of the portions of the first external electrode 13 on the first and second side surfaces 10c and 10d in the length direction L is preferably less than substantially half the length of the first and third portions 13a and 13c in the length direction L. The length of the first and third portions 13a and 13c in the length direction L is preferably, for example, about 200 μm to about 350 μm. The first external electrode 13 does not substantially project from the first side surface 10c or the second side surface 10d in the width direction W. With this configuration, the dimension of the ceramic electronic component 1 in the width direction W can be reduced. The first external electrode 13 may not necessarily be arranged substantially on the first side surface 10c or the second side surface 10d.

The second external electrode 14 is electrically connected to the second internal electrodes 12. The second external electrode 14 preferably includes a first portion 14a provided on the first main surface 10a, a third portion 14c provided on the second main surface 10b, and a second portion 14b provided on the second end surface 10f. In this preferred embodiment, the second external electrode 14 is preferably arranged so as to be shallowly wrapped around end portions of the first and second side surfaces 10c and 10d in the length direction L. Specifically, the length of the portions of the second external electrode 14 on the first and second side surfaces 10c and 10d in the length direction L is preferably less than substantially half the length of the first and third portions 14a and 14c in the length direction L. The length of the first and third portions 14a and 14c in the length direction L is preferably, for example, about 200 µm to about 350 µm. The second external electrode 14 does not substantially project from the first side surface 10c or the second side surface 10d in the width direction W. With the above configuration, the dimension of the ceramic electronic component 1 in the width direction W can be reduced. The second external electrode 14 may not necessarily be formed substantially on the first side surface 10c or the second side surface 10d.

The maximum thickness of each of the first and second external electrodes 13 and 14 may preferably range from, for example, about 10 µm to about 50 µm.

Next, the configuration of the first and second external electrodes 13 and 14 will be described with reference to FIG. 3. In this preferred embodiment, each of the first and second external electrodes 13 and 14 preferably includes a laminate of a first conductor layer 15 and a second conductor layer 16.

The first conductor layer 15 is provided on the first end surface 10e or the second end surface 10f and on an end of the first main surface 10a or the second main surface 10b in the length direction L.

Outer end portions of the first conductor layers 15 of the first and second external electrodes 13 and 14, which respectively define the first portions 13a and 14a, in the length direction L are preferably relatively thick. Similarly, outer end portions of the first conductor layers 15 of the first and second external electrodes 13 and 14, which respectively form the third portions 13c and 14c, in the length direction L are preferably relatively thick. Specifically, in portions of the first conductor layers 15 of the first and second external electrodes 13 and 14, which respectively define the first portions 13a and 14a, portions that do not face first reinforcement layers 17a are thicker than portions that face the first reinforcement layers 17a. Similarly, in portions of the first conductor layers 15 of the first and second external electrodes 13 and 14, which respectively define the third portion 13c and 14c, portions that do not face second reinforcement layers 17b are thicker than portions that face the second reinforcement layers 17b. Therefore, in each of the first and third portions 13a and 14a and 13c and 14c of the first and second external electrodes 13 and 14, a portion that does not face the first reinforcement layers 17a or the second reinforcement layers 17b is thicker than a portion that faces the first reinforcement layers 17a or the second reinforcement layers 17b. For example, the thickness of the outer end portion of the first conductor layer 15 may preferably be maximally in the range from about 5 µm to about 20 µm, whereas the thickness of an inner end portion of the first conductor layer 15 may preferably be maximally in the range from about 1 µm to about 10 µm.

A portion of the first conductor layer 15 that is provided on the first end surface 10e or the second end surface 10f is preferably thinner than a portion of the first conductor layer 15 that is provided on the first main surface 10a or the second main surface 10b. A portion of the second conductor layer 16 that is provided on the first end surface 10e or the second end surface 10f is preferably thinner than a portion of the second conductor layer 16 that is formed on the first end surface 10e or the second end surface 10f. For example, the thickness of a portion of each of the conductor layers 15 and 16 that is provided on the first end surface 10e or the second end surface 10f may preferably be maximally in the range from about 3 µm to about 10 µm.

The material of the first conductor layer 15 is not particularly limited. The first conductor layer 15 may preferably be made of a metal such as Ni, Cu, Ag, Pd, or Au or an alloy containing at least one of the above metals, such as an Ag—Pd alloy, for example. The first conductor layer 15 may also include an inorganic binder. Examples of the inorganic binder include the same type of ceramic material as the ceramic material included in the ceramic body 10 and a glass component. The content of the inorganic binder in the first conductor layer 15 is preferably in the range of, for example, about 40% by volume to about 60% by volume.

The second conductor layer 16 is arranged so as to cover end portions of the first and second main surfaces 10a and 10b in the length direction L and the first end surface 10e or the second end surface 10f. The second conductor layer 16 covers the first conductor layer 15.

In this preferred embodiment, the second conductor layer 16 is preferably made of one plating film or a laminate of a plurality of plating films, for example. The thickness of the second conductor layer 16 is not particularly limited. The maximum thickness of the second conductor layer 16 may preferably be in a range from, for example, about 5 µm to about 15 µm.

The material of the second conductor layer 16 is not particularly limited. The second conductor layer 16 may preferably be made of one metal selected from a group consisting of, for example, Cu, Ni, Sn, Pb, Au, Ag, Pd, Al, Bi, and Zn or may be formed of an alloy including this metal, for example. In particular, when the ceramic electronic component 1 is embedded in a wiring board, the outermost layer of the second conductor layer 16 is preferably made of one metal selected from a group consisting of Cu, Au, Ag, and Al or made of an alloy including this metal, for example, for the following reason. In some cases, the ceramic electronic component 1 may be embedded in a wiring board by irradiating the first and second external electrodes 13 and 14 with laser beams propagating through the wiring board, and the above metals efficiently reflect the laser beams.

An additional layer, such as a conductive resin layer arranged to relax stress may also preferably be provided between the first conductor layer 15 and the second conductor layer 16.

As illustrated in FIGS. 3 and 7, the first outer layer portion 10B includes the plurality of first reinforcement layers 17a. The plurality of first reinforcement layers 17a are arranged in the length direction L and in the width direction W. The plurality of first reinforcement layers 17a are stacked in the thickness direction T. The plurality of first reinforcement layers 17a are not provided in either end portion of the ceramic body 10 in the length direction L. The plurality of first reinforcement layers 17a are preferably successively disposed over a central portion of the ceramic body 10, except for both end portions in the length direction L. The plurality of first reinforcement layers 17a are disposed inside the ceramic body 10, and are not exposed from the surface of the ceramic body 10.

As illustrated in FIG. 3, portions of the plurality of first reinforcement layers 17a, namely, outer end portions in the length direction L, preferably face the first portions 13a and 14a of the first and second external electrodes 13 and 14 in the thickness direction T. That is, the outer end portions of the plurality of first reinforcement layers 17a in the length direction L face the first portions 13a and 14a of the first and second external electrodes 13 and 14 in the thickness direction T.

The number of first reinforcement layers 17a is not particularly limited but may preferably be, for example, about 1.5 times to about 15 times the number of first and second internal electrodes 11 and 12. Specifically, the number of first reinforcement layers 17a may preferably be, for example, about 3 to about 30. In this preferred embodiment, a plurality of first reinforcement layers 17a are preferably provided. However, only one first reinforcement layer 17a may be provided, for example.

The distance between first reinforcement layers 17a adjacent in the thickness direction is preferably less than the distance between first and second internal electrodes 11 and 12 adjacent in the thickness direction T. The distance between first reinforcement layers 17a adjacent in the thickness direction is preferably about 0.125 times to about 0.5 times the distance between first and second internal electrode 11 and 12 adjacent in the thickness direction T, for example. With the above configuration, the volume proportion of the plurality of first reinforcement layers 17a in a region in which the first reinforcement layers 17a are provided may preferably be greater than the volume proportion of the first and second internal electrodes 11 and 12 in the effective portion 10A in which the first and second internal electrodes 11 and 12 are provided.

As illustrated in FIG. 3, the second outer layer portion 10C includes the plurality of second reinforcement layers 17b. The plurality of second reinforcement layers 17b are arranged in the length direction L and in the width direction W. The plurality of second reinforcement layers 17b are stacked in the thickness direction T. The plurality of second reinforcement layers 17b are not provided in either end portion of the ceramic body 10 in the length direction L. The plurality of second reinforcement layers 17b are successively arranged over a central portion of the ceramic body 10, except for its both end portions in the length direction L. The plurality of second reinforcement layers 17b are disposed inside the ceramic body 10, and are not exposed from the surface of the ceramic body 10. In this preferred embodiment, the first reinforcement layers 17a and the second reinforcement layers 17b preferably have substantially the same shape when viewed in plan.

As illustrated in FIG. 3, portions of the plurality of second reinforcement layers 17b, namely, outer end portions in the length direction L, face the third portions 13c and 14c of the first and second external electrodes 13 and 14 in the thickness direction T. That is, the outer end portions of the plurality of second reinforcement layers 17b in the length direction L face the third portions 13c and 14c of the first and second external electrodes 13 and 14 in the thickness direction T.

The number of second reinforcement layers 17b is not particularly limited but may preferably be, for example, about 1.5 times to about 15 times the number of first and second internal electrodes 11 and 12. Specifically, the number of second reinforcement layer 17b may preferably be, for example, about 3 to about 30. In this preferred embodiment, a plurality of second reinforcement layers 17b are preferably provided. However, only one second reinforcement layer 17b may be provided.

The distance between second reinforcement layers 17b adjacent in the thickness direction T is preferably less than the distance between first and second internal electrodes 11 and 12 adjacent in the thickness direction T. The distance between second reinforcement layers 17b adjacent in the thickness direction T is preferably about 0.125 times to about 0.5 times the distance between first and second internal electrodes 11 and 12 adjacent in the thickness direction T, for example. With this configuration, the volume proportion of the plurality of second reinforcement layers 17b in a region in which the second reinforcement layers 17b are provided is greater than the volume proportion of the first and second internal electrodes 11 and 12 in the effective portion 10A in which the first and second internal electrodes 11 and 12 are provided.

The first and second reinforcement layers 17a and 17b may be made of any material that is more ductile and malleable than the material of the ceramic body 10. Each of the first and second reinforcement layers 17a and 17b may preferably be made of, for example, a metal such as Ni, Cu, Ag, Pd, or Au or an alloy containing at least one of the above metals, such as an Ag—Pd alloy.

Each of the first and second reinforcement layers 17a and 17b may preferably have a thickness of, for example, about 0.3 μm to about 2.0 μm. The thicknesses of the first and second reinforcement layers 17a and 17b may be equal or substantially equal to the thicknesses of the first and second internal electrodes 11 and 12, respectively, or may be made less than or greater than the thicknesses of the first and second internal electrodes 11 and 12, respectively. The thicknesses of the first and second reinforcement layers 17a and 17b are preferably greater than or equal to the thicknesses of the first and second internal electrodes 11 and 12, respectively. With this configuration, the volume proportion of the plurality of second reinforcement layers 17b in a region in which the second reinforcement layers 17b are provided is greater than the volume proportion of the first and second internal electrodes 11 and 12 in the effective portion 10A where the first and second internal electrodes 11 and 12 are provided.

Preferably, the length of the first and second reinforcement layers 17a and 17b in the length direction L, the sum of the length of the first internal electrodes 11 and the length of the first dummy electrodes 18 in the length direction L, and the sum of the length of the second internal electrodes 12 and the length of the second dummy electrodes 19 in the length direction L are equal or substantially to one another, for example. In this case, the number of kinds of ceramic green sheets each having a conductive paste printed on a surface thereof, which are needed to manufacture the ceramic electronic component 1, is reduced. Accordingly, the ceramic electronic component 1 can be manufactured easily and inexpensively.

In this preferred embodiment, as illustrated in FIG. 3, a thickness T2 of both end portions of the ceramic body 10 in which the first reinforcement layers 17a or the second reinforcement layers 17b are not provided in the length direction is preferably less than a thickness T1 of a portion of the ceramic body 10 where the first and third portions 13a and 14a and 13c and 14c of the first and second external electrodes 13 and 14 face the first and second reinforcement layers 17a and 17b in the thickness direction T. Thus, as illustrated in detail in FIG. 4, in a portion of the first main surface 10a of the ceramic body 10 in which the first portion 13a or 14a of the first external electrode 13 or the second external electrode 14 is provided, an end portion 10a1 or 10a2 that does not overlap the first reinforcement layers 17a in the length direction L is closer to the center in the thickness direction T than a portion that overlaps the first reinforcement layers 17a. Further, in a portion of the second main surface 10b of the ceramic body 10 in which the third portion 13c or 14c of the first external electrode 13 or the second external electrode 14 is provided, an end portion 10b1 or 10b2 that does not overlap the second reinforcement layers 17b in the length direction L is closer to the center in the thickness direction T than a portion that overlaps the second reinforcement layers 17b.

Additionally, the outer end portions of the first portions 13a and 14a of the first and second external electrodes and 14 in the length direction L in which the first reinforcement layers 17a are not provided (the end portion near the first end surface 10e or the second end surface 10f) are preferably thicker than other portions. The outer end portions of the third portions 13c and 14c of the first and second external electrodes 13 and 14 in the length direction L in which the second reinforcement layers 17b are not provided (the end portion near the first end surface 10e or the second end surface 10f) are preferably thicker than other portions.

Next, an example of a method for manufacturing the ceramic electronic component 1 according to a preferred embodiment of the present invention will be described.

Figure 8:
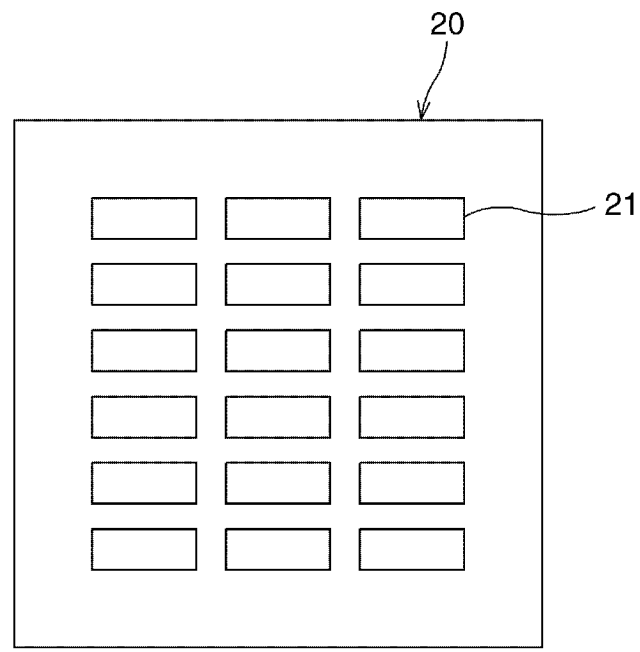
FIG. 8 is a schematic plan view of a ceramic green sheet on which conductor patterns are provided.

First, a ceramic green sheet 20 (see FIG. 8) including a ceramic material for forming the ceramic body 10 is prepared. Then, as illustrated in FIG. 8, a conductive paste is applied onto the ceramic green sheet 20 to form conductor patterns 21. Conductor patterns may be formed using, for example, any suitable printing method, such as a screen printing method. The conductive paste may preferably include conductive particles and any known binder and solvent.

In this preferred embodiment, the length of the first and second reinforcement layers 17a and 17b in the length direction L, the sum of the length of the first internal electrodes 11 and the length of the first dummy electrodes 18 in the length direction L, and the sum of the length of the second internal electrodes 12 and the length of the second dummy electrodes 19 in the length direction L are preferably equal or substantially equal to one another. Thus, a ceramic green sheet for forming the first internal electrodes 11 and the first dummy electrodes 18, a ceramic green sheet 20 for forming the second internal electrodes 12 and the second dummy electrodes 19, a ceramic green sheet 20 for forming the first reinforcement layers 17a, and a ceramic green sheet 20 for forming the second reinforcement layers 17b may have common specifications. That is, only one kind of ceramic green sheet 20 with a conductive paste printed thereon may be prepared.

Figure 9:
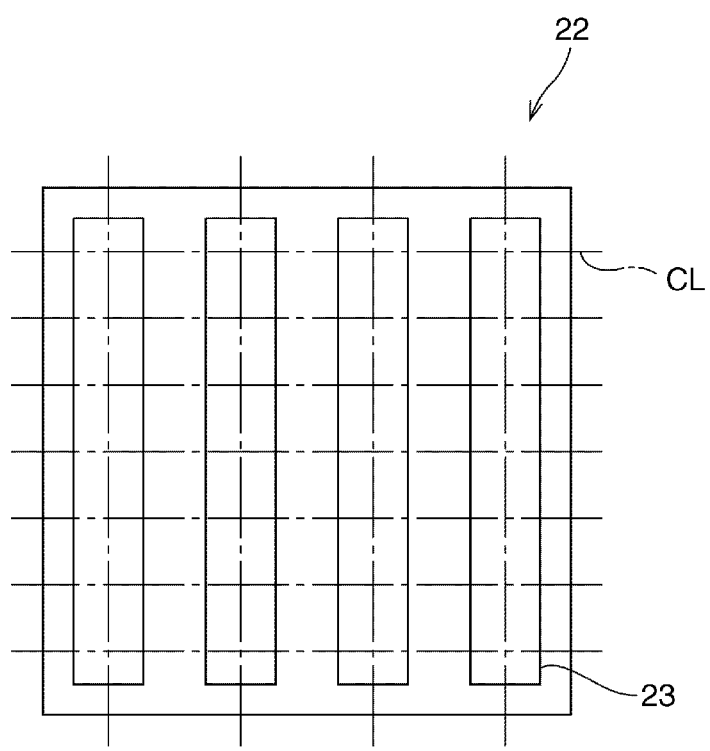
FIG. 9 is a schematic plan view of a mother laminate.
Figure 10:
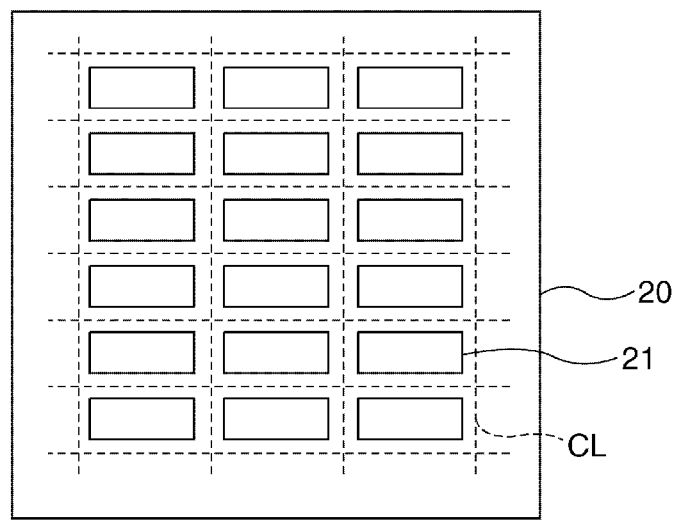
FIG. 10 is a schematic plan view illustrating positions of cutting lines on a ceramic green sheet along which the mother laminate is cut to form first internal electrodes and first dummy electrodes.
Figure 11:
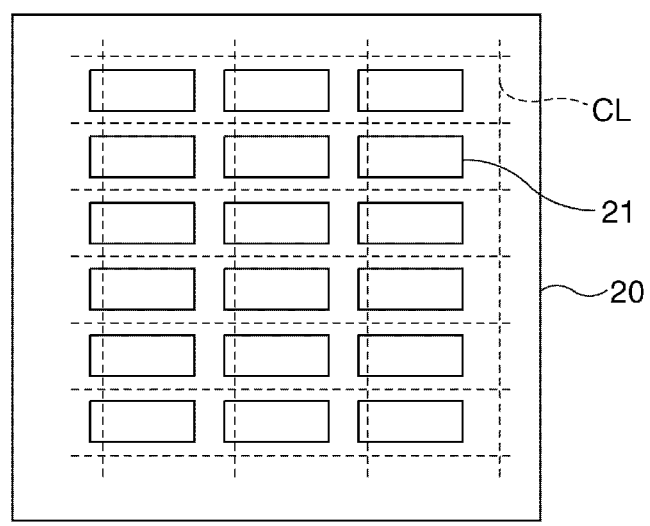
FIG. 11 is a schematic plan view illustrating positions of cutting lines on a ceramic green sheet along which the mother laminate is cut to form second internal electrodes and second dummy electrodes.
Figure 12:
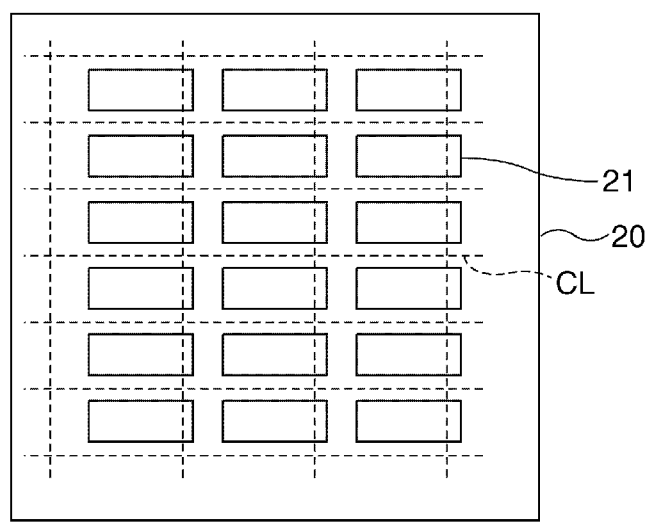
FIG. 12 is a schematic plan view illustrating positions of cutting lines on a ceramic green sheet along which the mother laminate is cut to form reinforcement layers.

Then, as illustrated in FIGS. 10 to 12, a ceramic green sheet 20 on which no conductor patterns 21 are formed, and a ceramic green sheet 20 on which conductor patterns 21 are formed are stacked such that the ceramic green sheets 20 are shifted in the length direction L as desired, and are pressed in the stacking direction by hydrostatic pressure or other suitable pressing device, for example, to fabricate a mother laminate 22 illustrated in FIG. 9.

In this preferred embodiment, one ceramic green sheet is located between the reinforcement layers 17a and 17b adjacent in the thickness direction T. In contrast, a plurality of ceramic green sheets 20 are located between the first and second internal electrodes 11 and 12 adjacent in the thickness direction T.

Then, as illustrated in FIG. 9, conductor patterns 23 having shapes corresponding to the portions forming the first and third portions 13a and 14a and 13c and 14c of the first and second external electrodes 13 and 14 on the first conductor layers 15 are formed on the mother laminate 22 using an appropriate printing method, such as a screen printing method, for example.

Then, the mother laminate 22 is pressed in the stacking direction again. In this case, the mother laminate 22 is pressed so that the thickness of the portions in which the reinforcement layers 17a and 17b and the first and second internal electrodes and 12 do not overlap is minimized, that is, so that, as illustrated in FIG. 3, the thickness T2 is less than the thickness T1. For example, pressing with an elastic body disposed between a press mold and the main surface of the mother laminate 22 allows a portion in which the reinforcement layers 17a and 17b and the first and second internal electrodes 11 and do not overlap to be effectively pressed down. Thus, the thickness relationship as described above is feasible.

Then, the mother laminate 22 is cut along imaginary cut lines CL to fabricate a plurality of raw ceramic laminates from the mother laminate 22. The mother laminate 22 may be cut by dicing or press-cutting, for example.

After the formation of raw ceramic laminates, preferably the corners and edges of the raw ceramic laminates may be chamfered or R-chamfered and surface layers of the raw ceramic laminates may be polished using barrel polishing or other suitable method, for example.

After that, conductive pastes are applied to both end surfaces of each of the raw ceramic laminates using a suitable method, for example, a dipping method. The applied conductive pastes and the conductor patterns 23 form the conductor layers 15 illustrated in FIG. 3.

If conductive pastes are applied to both end surfaces of a raw ceramic laminate using, for example, a dipping method or other suitable method, the conductive pastes may also preferably be slightly wrapped around the first and second side surfaces and the first and second main surfaces. Thus, a conductive paste layer that forms a first conductor layer 15 in a following firing process is relatively thick in the end portions of the first and second main surfaces 10a and 10b near the first end surface 10e or the second end surface 10f. Accordingly, the outer end portions of the first conductor layer 15 in the length direction L are relatively thick, which results in the outer end portions of the first and third portions 13a and 14a and 13c and 14c of the first and second external electrodes 13 and 14 in the length direction L being relatively thick. Further, the thickness of the first conductor layer 15 formed on the first end surface 10e or the second end surface 10f can preferably be reduced by, after applying a conductive paste to the first end surface 10e or the second end surface 10f, pressing the first end surface 10e or the second end surface 10f against a surface plate, and removing the excess conductive paste.

Then, the raw ceramic laminates are fired. In this firing process, the conductive paste layer formed in the manner described above is also fired (co-fired), and the conductor layers 15 are formed. The firing temperature can be set as desired in accordance with the type of the ceramic material and conductive paste to be used. The firing temperature may preferably be set to, for example, about 900° C. to about 1300° C.

After that, polishing, such as barrel polishing, is performed as necessary.

Finally, the conductor layers 16 are formed by plating to complete the first and second external electrodes 13 and 14. The conductor layers 16 formed of plating films are not essential. For example, the first and second external electrodes 13 and 14 may be formed of only the conductor layers 15.

In this preferred embodiment, as described previously, in the portion of the first main surface 10a of the ceramic body 10 in which the first portion 13a or 14a of the first external electrode 13 or the second external electrode 14 is provided, the end portion 10a1 or 10a2 that does not overlap the first reinforcement layers 17a in the length direction L is preferably closer to the center in the thickness direction T than the portion that overlaps the first reinforcement layers 17a. Therefore, for example, if stress is applied from outside, such as when the ceramic electronic component 1 is mounted on a wiring board with the first main surface 10a directed toward the wiring board, the ceramic electronic component 1 can be effectively prevented from being damaged. Thus, the mechanical durability of the ceramic electronic component 1 can be improved. This advantage will be described in detail hereinafter.

In the ceramic electronic component 1, the first and second external electrodes 13 and 14 are provided on the first and second main surfaces 10a and 10b. Thus, both end portions of the ceramic electronic component 1 in the length direction L project in the thickness direction T. Therefore, both end portions of the ceramic electronic component 1 in the length direction L are susceptible to stress. The stress applied to both end portions of the ceramic electronic component 1 in the length direction L produces stress concentration to portions 10D and 10E (see FIG. 3) in which the leading ends of the first and third portions 13a and 14a and 13c and 14c are located and in which the thickness of the ceramic electronic component 1 greatly changes, and the portions 10D and 10E are susceptible to cracks.

Here, for example, if both end portions of the ceramic electronic component 1 are the thickest, the distance between end portions of the ceramic electronic component 1 that define fulcra and the portions 10D and 10E that define points of action is relatively large, which results in a large stress being applied to the portions 10D and 10E.

In contrast, in this preferred embodiment, in the portion of the first main surface 10a of the ceramic body 10 in which the first portion 13a or 14a of the first external electrode 13 or the second external electrode 14 is provided, the end portion 10a1 or 10a2 that does not overlap the first reinforcement layers 17a in the length direction L is closer to the center in the thickness direction T than the portion that overlaps the first reinforcement layers 17a. Therefore, most of the projecting portions of the ceramic electronic component 1 in the thickness direction T are closer to the center than the end portions. Consequently, the distance between the portions 10D and 10E defining points of action and the fulcra is reduced. The reduction in distance prevents a large stress from being exerted on the portions 10D and 10E, and prevents the portions 10D and 10E in the ceramic body 10 from being damaged. Therefore, a higher mechanical durability is achieved.

Furthermore, in this preferred embodiment, the portions 10D and 10E, which may be easily damaged, preferably include the first and second reinforcement layers 17a and 17b. Thus, the mechanical strength of the portions 10D and 10E is effectively improved.

In this preferred embodiment, the first and second reinforcement layers 17a and 17b are successively provided over the central portion of the ceramic body 10, except for both end portions in the length direction L. Thus, the mechanical strength of the central portion of the portions ceramic body 10 in the length direction L, which may also be easily damaged in addition to the portions 10D and 10E, is also effectively increased.

Furthermore, in this preferred embodiment, the thickness T2 of both end portions of the ceramic body 10 in the length direction in which the first reinforcement layers 17a or the second reinforcement layers 17b are not provided is preferably less than the thickness T1 of the portion of the ceramic body 10 in which the first and third portions 13a and 14a and 13c and 14c of the first and second external electrodes 13 and 14 face the first and second reinforcement layers 17a and 17b in the thickness direction T. Further, the portions of the first and third portions 13a and 14a and 13c and 14c of the first and second external electrodes 13 and 14, which are provided on the portion at which the thickness T2 is less than the thickness T1, are relatively thick. Thus, the surfaces of the first and third portions 13a and 14a and 13c and 14c of the first and second external electrodes 13 and 14 are substantially flat. The substantially flat surfaces allow stress to be applied to substantially the entire first and third portions 13a and 14a and 13c and 14c without causing stress concentration at a portion thereof. Thus, a large stress is effectively prevented from being applied to a portion of the first and third portions 13a and 14a and 13c and 14c. Therefore, an increased mechanical durability is achieved.

In this preferred embodiment, the distance between reinforcement layers 17a and 17b adjacent in the thickness direction is preferably less than the distance between first and second internal electrodes 11 and 12 adjacent in the thickness direction. With this configuration, the volume proportion of the reinforcement layers 17a and 17b in a region in which the reinforcement layers 17a and 17b are provided is large. Therefore, the mechanical strength of the region of the ceramic body 10 in which the reinforcement layers 17a and 17b are provided is increased. Accordingly, the mechanical strength of the ceramic electronic component 1 is further increased.

Furthermore, since the distance between adjacent reinforcement layers 17a and 17b in the thickness direction is relatively small, a greater number of reinforcement layers 17a and 17b may be provided. Therefore, the mechanical strength of the ceramic electronic component 1 is further increased.

When the number of internal electrodes 11 and 12 is relatively large, the effect of the internal electrodes 11 and 12 on improvement in mechanical strength is large, and the thickness of the ceramic body 10 is also large, which results in an increase in the mechanical strength of the ceramic electronic component 1. In contrast, when the number of internal electrodes 11 and 12 is relatively small, for example, about 2 to about 20, the effect of the internal electrodes 11 and 12 on improving mechanical strength is relatively small, and the ceramic body 10 is relatively thin, which results in the mechanical strength problem with the ceramic electronic component 1 being noticeable. Therefore, as in this preferred embodiment, the technology for improving the mechanical durability of the ceramic electronic component 1 by providing the reinforcement layers 17a and 17b and by lowering the end portions of the first main surface 10a in the length direction L so that the end portions are close to the center in the thickness direction T is particularly effective when the number of layers of the internal electrodes 11 and 12 is small, for example, about 2 to about 20.

Other examples of preferred embodiments of the present invention will be described hereinafter. In the following description, members having functions substantially common to those in the first preferred embodiment are represented by common numerals and descriptions thereof are omitted.

Second Preferred Embodiment

Figure 13:
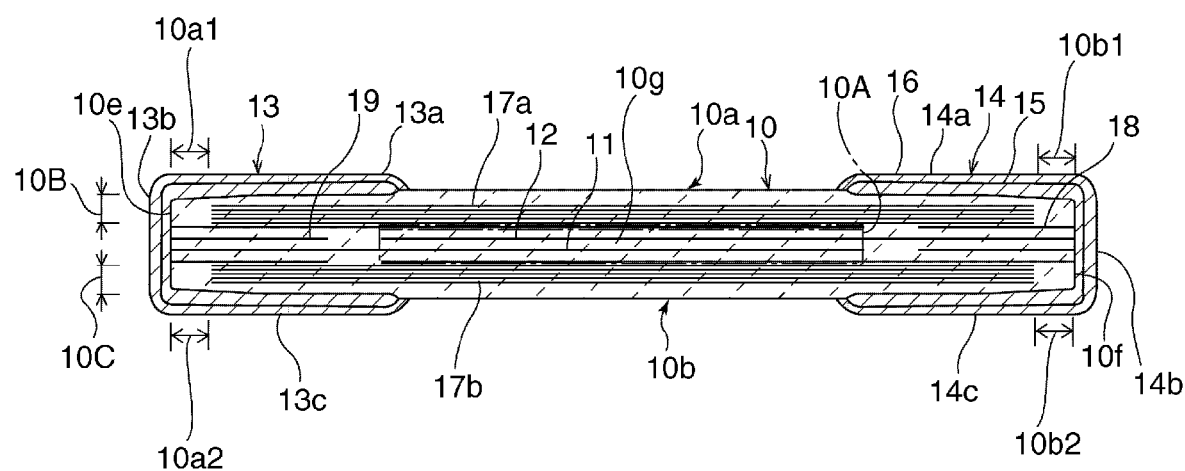
FIG. 13 is a schematic cross-sectional view of a ceramic electronic component according to a second preferred embodiment of the present invention.

FIG. 13 is a schematic cross-sectional view of a ceramic electronic component according to a second preferred embodiment of the present invention.

In this preferred embodiment, as illustrated in FIG. 13, at least a portion of the first and third portions 13a and 14a and 13c and 14c of the first and second external electrodes 13 and 14 is preferably embedded in the first main surface 10a or the second main surface 10b. Even in this case, similarly to the first preferred embodiment, the mechanical durability of the ceramic electronic component 1 is effectively improved.

The ceramic electronic component according to this preferred embodiment may be formed by, for example, printing, on the main surfaces of a mother laminate 22, conductor patterns 23 having shapes corresponding to the portions defining the first and third portion 13a and 14a and 13c and 14c and then by pressing the mother laminate in the stacking direction such that the mother laminate 22 is pressed with stronger force. Therefore, the embedded portions as described above can be formed.

Third Preferred Embodiment

Figure 14:
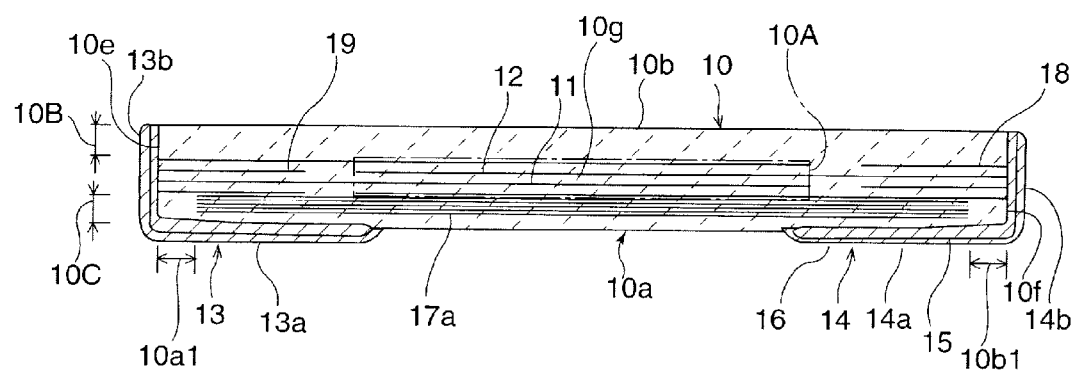
FIG. 14 is a schematic cross-sectional view of a ceramic electronic component according to a third preferred embodiment of the present invention.

FIG. 14 is a schematic cross-sectional view of a ceramic electronic component according to a third preferred embodiment of the present invention.

In the first preferred embodiment, the first and second external electrodes 13 and 14 are preferably provided on each of the first and second main surfaces 10a and 10b, by way of example. However, the present invention is not limited to this configuration, and at least one external electrode may be provided on the first main surface 10a.

For example, as illustrated in FIG. 14, the first and second external electrodes 13 and 14 may preferably be arranged so as to cover the first end surface 10e or the second end surface 10f and the first main surface 10a. That is, as long as the first and second external electrodes 13 and 14 include the first portions 13a and 14a, respectively, and are electrically connected to the first internal electrode 11 or the second internal electrode 12, the shapes of the first and second external electrodes 13 and 14 are not particularly limited.

Also in this preferred embodiment, the second reinforcement layers 17b may preferably be provided in addition to the first reinforcement layers 17a. However, the mechanical durability of the ceramic electronic component 1 can be improved by providing only the first reinforcement layers 17a on the side in which the first portions 13a and 14a are provided. Furthermore, the thickness of the ceramic electronic component 1 can be further reduced by not providing the third portion 13c or 14c or the second reinforcement layers 17b.

EXAMPLE

An Example of the ceramic electronic component 1 according to the first preferred embodiment was fabricated using the manufacturing method described above. The detailed conditions are provided below. As a result of observing the cross section of the ceramic electronic component 1 obtained in the Example with an electron microscope, it has been found that both end portions of each of the first and second main surfaces 10a and 10b were made close to the center in the thickness direction T.

Conditions in Example

Dimensions: about 1.0 mm in length, about 0.5 mm in width, about 0.15 mm in thickness
Design capacity: about 1 nF
Ceramic material used to fabricate ceramic body: dielectric ceramics containing $BaTiO_3$ as a main component
Thickness of ceramic layer (after firing): about 1.35 μm
Material of internal electrodes 11 and 12 and dummy electrodes 18 and 19: Ni
Thickness of internal electrodes 11 and 12 and dummy electrodes 18 and 19 (after firing): about 0.75 μm
Distance between internal electrodes 11 and 12: about 9.45 μm
Number of internal electrodes 11 and 12: 4
Number of first reinforcement layers 17a and number of second reinforcement layers 17b: 20
Material of first and second reinforcement layers 17a and 17b: Ni
Distance between reinforcement layers in first and second reinforcement layers 17a and 17b: about 1.35 μm
Maximum firing temperature: about 1200° C.
Firing time: about 2 hours
Firing atmosphere: Reducing atmosphere
Material of first conductor layer 15: Ni
Material of second conductor layer 16: Cu Comparative Example 1

A ceramic electronic component was fabricated in a manner similar to that in Example described above, except that the first and second reinforcement layers 17a and 17b were not provided.

Comparative Example 2

Figure 15:
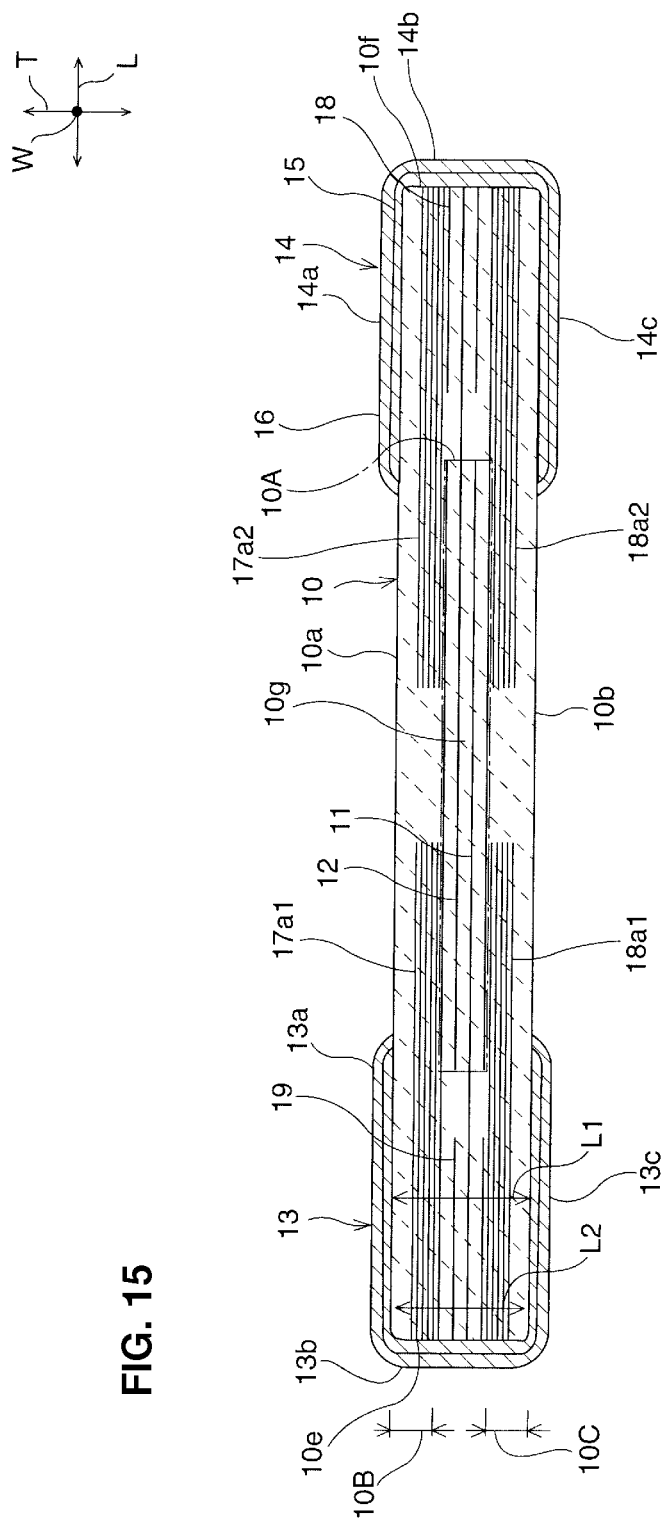
FIG. 15 is a schematic cross-sectional view of a ceramic electronic component according to a Comparative Example 2.

FIG. 15 is a schematic cross-sectional view of a ceramic electronic component according to Comparative Example 2. As illustrated in FIG. 15, a ceramic electronic component was fabricated in a manner similar to that in Example described above, except that reinforcement layers 17a1, 17a2, 18a1, and 18a2 are arranged so as to extend from the first and second end surfaces 10e and 10f towards the center. The total length of the reinforcement layers 17a1 and 17a2 and the total length of the reinforcement layers 18a1 and 18a2 were equal or substantially equal to the length of the reinforcement layers 17a and the length of the reinforcement layers 17b in Example described above, respectively.

As a result of observing the cross section of the ceramic electronic component obtained in Comparative Example 2 with an electron microscope, it has been found that both ends of each of the first and second main surfaces 10a and 10b were not close to the approximate center in the thickness direction but were relatively flat.

In FIG. 15, for convenience of illustration, members having functions substantially the same as those in the first preferred embodiment are represented by common numerals and descriptions thereof are omitted.

EVALUATION

Figure 16:
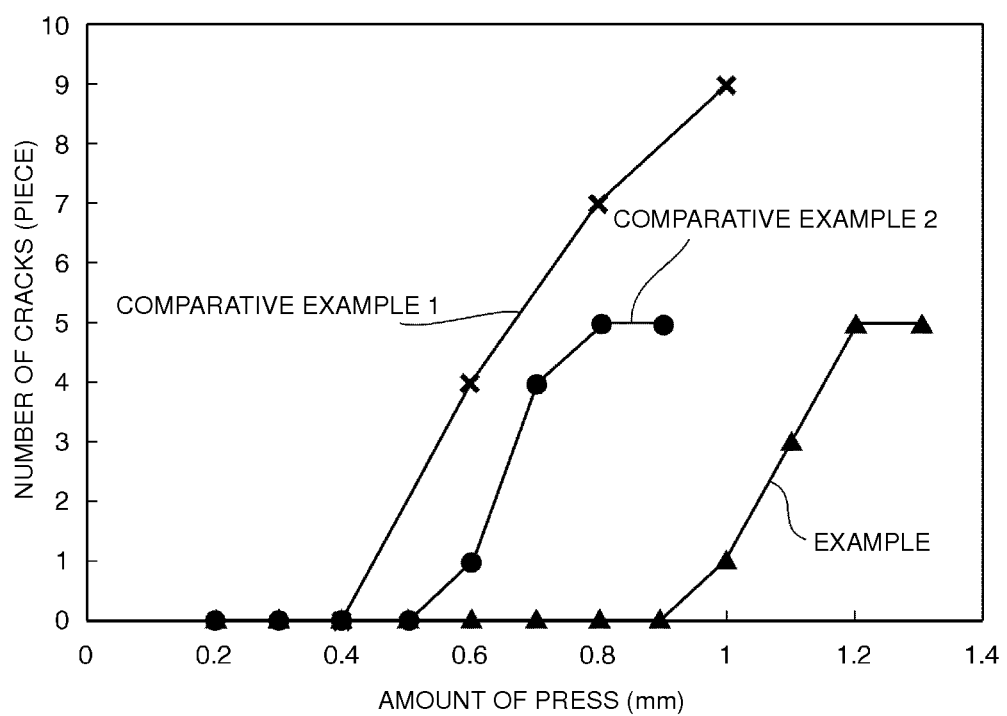
FIG. 16 is a graph illustrating the numbers of cracks in ceramic electronic components in an Example and Comparative Examples 1 and 2.

The ceramic electronic component fabricated in the Example and the ceramic electronic components fabricated in Comparative Examples 1 and 2 were evaluated by pressing each sample against a steel plate using a mounter with model name YG100B, manufactured by Yamaha Motor Co., Ltd., and then observing whether or not cracks occurred in the sample using an optical microscope. Ten samples were tested for each condition of the amount of press. FIG. 16 illustrates test results.

As illustrated in FIG. 16, the Example in which the reinforcement layers 17a and 17b are provided had a lower rate of occurrence of cracks than Comparative Example 1 in which no reinforcement layers are provided or Comparative Example 2 in which the reinforcement layers 17a1, 17a1, 18a1, and 18a2 are provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ceramic electronic component comprising:
    a ceramic body having a substantially rectangular parallelepiped shape including a first main surface, a second main surface, a first side surface, a second side surface, a first end surface, and a second end surface, the first main surface and the second main surface extending in a length direction of the ceramic body and in a width direction of the ceramic body, the first side surface and the second side surface extending in the length direction and in a thickness direction of the ceramic body, the first end surface and the second end surface extending in the width direction and in the thickness direction;
    a first internal electrode and a second internal electrode provided inside the ceramic body, the first internal electrode and the second internal electrode extending in the length direction and in the width direction and facing each other in the thickness direction;
    a first external electrode provided on the ceramic body and electrically connected to the first internal electrode;
    a second external electrode provided on the ceramic body and electrically connected to the second internal electrode; wherein
    each of the first external electrode and the second external electrode includes a first portion located on an end portion of the first main surface in the length direction, and a second portion located on the first end surface or the second end surface;
    the ceramic body includes an effective portion in which the first internal electrode and the second internal electrode face each other in the thickness direction, a first outer layer portion that is located closer to the first main surface than the effective portion, and a second outer layer portion that is located closer to the second main surface than the effective portion;
    a first reinforcement layer provided in the first outer layer portion so as to extend in the length direction and in the width direction, the first reinforcement layer including a portion facing the first portion of the first external electrode in the thickness direction and a portion facing the first portion of the second external electrode in the thickness direction;
    the first reinforcement layer is not exposed at the first end surface or the second end surface;
    in a portion of the first main surface of the ceramic body in which the first portion of the first external electrode or the second external electrode is provided, a portion of the first main surface of the ceramic body that does not face the first reinforcement layer is closer to a center of the ceramic body in the thickness direction than a portion of the first main surface of the ceramic body that faces the first reinforcement layer; and
    a dimension of the ceramic body in the thickness direction is about 0.3 mm or less.

2. The ceramic electronic component according to claim 1, wherein in the first portion of each of the first external electrode and the second external electrode, a portion that does not face the first reinforcement layer is thicker than a portion that faces the first reinforcement layer.

3. The ceramic electronic component according to claim 2, wherein each of the first external electrode and the second external electrode includes:
    a first conductor layer provided on the first end surface or the second end surface and on an end portion of the first main surface in the length direction; and
    a second conductor layer arranged so as to cover the first conductor layer; and
    in a portion of the first conductor layer of each of the first external electrode and the second external electrode that defines the first portion, a portion that does not face the first reinforcement layer is thicker than a portion that faces the first reinforcement layer.

4. The ceramic electronic component according to claim 1, wherein the first reinforcement layer is made of a metal or an alloy.

5. The ceramic electronic component according to claim 1, wherein each of the first external electrode and the second external electrode further includes a third portion located on an end portion of the second main surface in the length direction;
    the ceramic electronic component further includes a second reinforcement layer provided in the second outer layer portion so as to extend in the length direction and in the width direction, the second reinforcement layer including a portion facing the third portion of the first external electrode in the thickness direction and a portion facing the third portion of the second external electrode in the thickness direction;
    the second reinforcement layer is not exposed at the first end surface or the second end surface; and
    in a portion of the second main surface of the ceramic body in which the third portion of the first external electrode or the second external electrode is provided, a portion of the second main surface of the ceramic body that does not face the second reinforcement layer is closer to the center of the ceramic body in the thickness direction than a portion of the second main surface of the ceramic body that faces the second reinforcement layer.

* * * * *